United States Patent
Hong et al.

(10) Patent No.: US 10,586,892 B2
(45) Date of Patent: Mar. 10, 2020

(54) LIGHT EMITTING DEVICE WITH AN ELECTROSTATIC DISCHARGE (ESD) SUPPRESSION PATTERN HAVING FIRST AND SECOND CONDUCTIVE PARTICLES DISPERSED IN A RESIN

(71) Applicant: LG INNOTEK CO., LTD., Seoul (KR)

(72) Inventors: Jun Hee Hong, Seoul (KR); Deok Ki Hwang, Seoul (KR); Hoe Jun Kim, Seoul (KR); Woo Sik Lim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/770,158

(22) PCT Filed: Oct. 21, 2016

(86) PCT No.: PCT/KR2016/011922
§ 371 (c)(1),
(2) Date: Apr. 20, 2018

(87) PCT Pub. No.: WO2017/069577
PCT Pub. Date: Apr. 27, 2017

(65) Prior Publication Data
US 2018/0309026 A1     Oct. 25, 2018

(30) Foreign Application Priority Data
Oct. 21, 2015   (KR) .................. 10-2015-0146615

(51) Int. Cl.
*H01L 33/36*   (2010.01)
*H01L 25/16*   (2006.01)
(Continued)

(52) U.S. Cl.
CPC ............ *H01L 33/36* (2013.01); *H01L 25/167* (2013.01); *H01L 33/382* (2013.01); *H01L 33/44* (2013.01); *H01L 33/486* (2013.01); *H01L 33/62* (2013.01)

(58) Field of Classification Search
CPC ...... H01L 33/36; H01L 33/005; H01L 25/167
See application file for complete search history.

(56) References Cited

U.S. PATENT DOCUMENTS

| | | | |
|---|---|---|---|
| 2011/0012144 A1* | 1/2011 | An | H01L 25/167 257/91 |
| 2013/0020598 A1* | 1/2013 | Yang | H01L 25/167 257/98 |
| 2015/0138827 A1* | 5/2015 | Song | H01L 25/167 362/606 |

FOREIGN PATENT DOCUMENTS

| | | |
|---|---|---|
| JP | 2005-136177 | 5/2005 |
| JP | 2005-340849 | 12/2005 |

(Continued)

OTHER PUBLICATIONS

International Search Report (with English Translation) and Written Opinion dated Jan. 20, 2017 issued in Application No. PCT/KR2016/011922.

*Primary Examiner* — Andrew Q Tran
(74) *Attorney, Agent, or Firm* — KED & Associates, LLP

(57) ABSTRACT

One embodiment relates to a light emitting device which is free from electrostatic discharge by using an electrostatic discharge suppressing pattern including a resin having particles conductive and dispersed therein, the light emitting device comprising: a light emitting structure including a first conductive semiconductor layer, an active layer, and a second conductive semiconductor layer; a first electrode connected with the first conductive semiconductor layer; a second electrode connected with the second conductive
(Continued)

semiconductor layer; and an electrostatic discharge suppressing pattern, which is overlapped with the first electrode and the second electrode, and of which first particles are dispersed in the resin so as to cover a gap between the first electrode and the second electrode.

20 Claims, 13 Drawing Sheets

(51) Int. Cl.
*H01L 33/44* (2010.01)
*H01L 33/62* (2010.01)
*H01L 33/48* (2010.01)
*H01L 33/38* (2010.01)

(56) References Cited

FOREIGN PATENT DOCUMENTS

| KR | 10-0748241 | 8/2007 |
| KR | 10-2011-0134232 | 12/2011 |
| KR | 10-2015-0010211 | 1/2015 |

\* cited by examiner

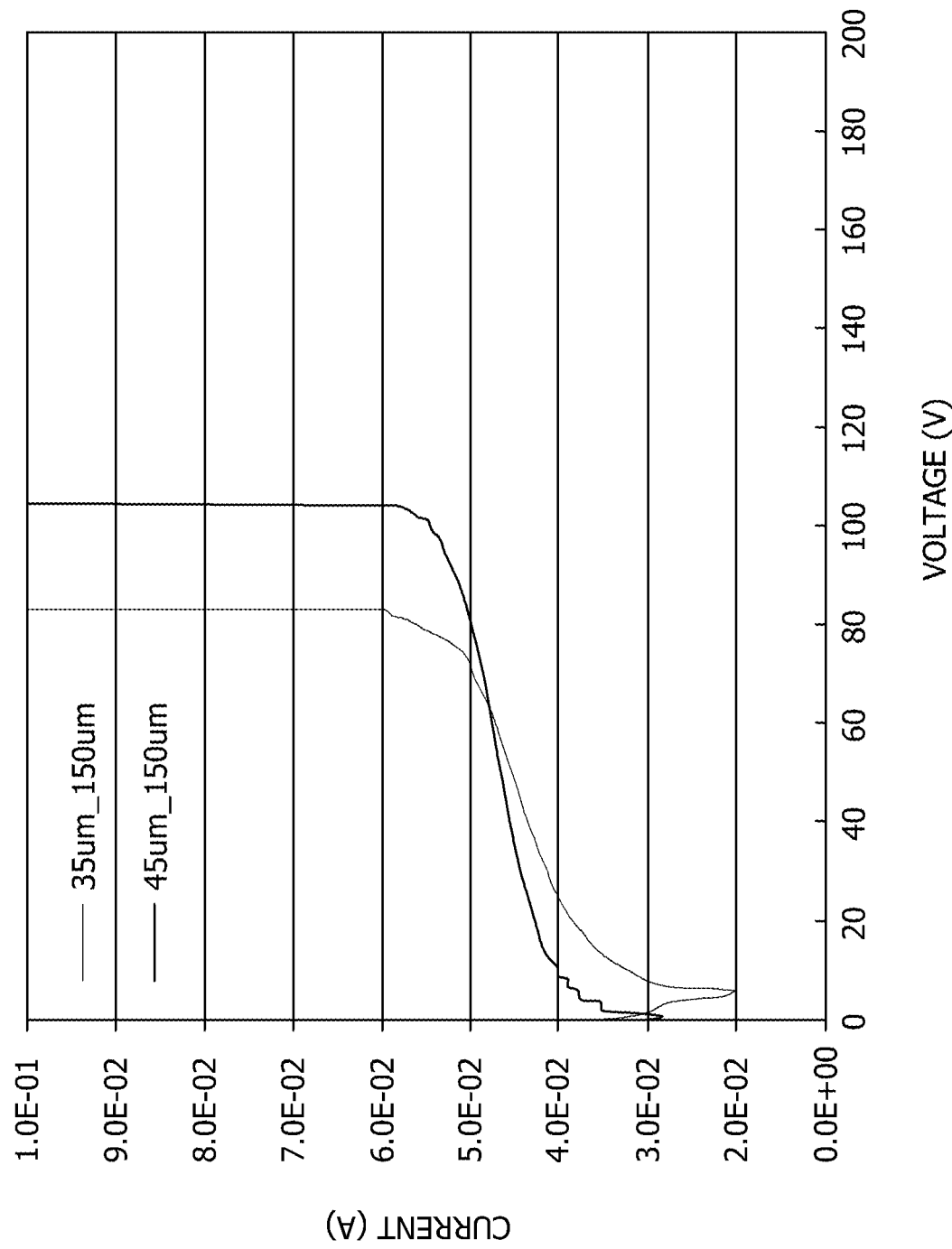

LIGHT EMITTING DEVICE WITH AN ELECTROSTATIC DISCHARGE (ESD) SUPPRESSION PATTERN HAVING FIRST AND SECOND CONDUCTIVE PARTICLES DISPERSED IN A RESIN

CROSS-REFERENCE TO RELATED PATENT APPLICATIONS

This application is a U.S. National Stage Application under 35 U.S.C. § 371 of PCT Application No. PCT/KR2016/011922, filed Oct. 21, 2016, which claims priority to Korean Patent Application No. 10-2015-0146615, filed Oct. 21, 2015, whose entire disclosures are hereby incorporated by reference.

TECHNICAL FIELD

Embodiments of the present disclosure relate to a light emitting device which is free from electrostatic discharge.

BACKGROUND ART

A light emitting diode (LED) is one of light emitting elements that emit light when a current is supplied thereto. LEDs can emit light having high efficiency at a low voltage and thus have a high energy saving effect. Recently, a problem with the luminance of LEDs has been significantly addressed, and LEDs are being applied in various devices such as backlight units of liquid crystal display (LCD) devices, electronic sign boards, indicators, home appliances, and the like.

LEDs may have a structure in which a first electrode and a second electrode are disposed on one side of a light emitting structure including a first conductive semiconductor layer, an active layer, and a second conductive semiconductor layer. However, when electrostatic discharge (ESD) occurs, a current may flow in a reverse direction, thereby damaging the active layer in which light is generated.

In order to address this problem, a method of mounting a device, such as a Zener diode, a varistor, a transient voltage suppression (TVS) device, or the like, during packaging of a light emitting device has been proposed. In this case, however, since a process of mounting the device is further added and the device absorbs light emitted from the light emitting device, a problem of lowering the light emitting output of the light emitting device occurs.

DISCLOSURE

Technical Problem

Embodiments of the present disclosure are directed to providing a light emitting device which is free from electrostatic discharge through an electrostatic discharge suppression pattern having a structure in which conductive particles are dispersed in a resin.

Technical Solution

One aspect of the present disclosure provides a light emitting device including a light emitting structure including a first conductive semiconductor layer, an active layer, and a second conductive semiconductor layer, a first electrode connected to the first conductive semiconductor layer, a second electrode connected to the second conductive semiconductor layer, and an electrostatic discharge suppression pattern configured to overlap the first electrode and the second electrode, having first particles conductive and dispersed in a resin, and configured to cover a gap between the first electrode and the second electrode.

Another aspect of the present disclosure provides a light emitting device including a light emitting structure including a first conductive semiconductor layer, an active layer, and a second conductive semiconductor layer, a first electrode connected to the first conductive semiconductor layer, a second electrode connected to the second conductive semiconductor layer, a first lead frame connected to the first electrode through a first wire, a second lead frame connected to the second electrode through a second wire, and an electrostatic discharge suppression pattern configured to overlap the first lead frame and the second lead frame, having first particles conductive and dispersed in a resin, configured to cover a gap between the first lead frame and the second lead frame.

The electrostatic discharge suppression pattern may have an insulating property or conductivity on the basis of a threshold voltage thereof, and when a voltage lower than the threshold voltage is supplied between the first electrode and the second electrode, the electrostatic discharge suppression pattern may insulate the first electrode from the second electrode.

Further, when a voltage higher than or equal to the threshold voltage is supplied between the first electrode and the second electrode, the electrostatic discharge suppression pattern may electrically connect the first electrode to the second electrode.

Advantageous Effects

A light emitting device of the present disclosure has the following effects.

First, an electrostatic discharge suppression pattern including a resin in which first particles are dispersed is disposed between first and second electrodes and disposed to partially cover the first and second electrodes, and thus the electrostatic discharge suppression pattern functions as an insulator or a conductor based on a threshold voltage thereof. Therefore, when a voltage higher than or equal to the threshold voltage is supplied to the light emitting device, the electrostatic discharge suppression pattern can function as a conductor and thus a current path can be formed between the first and second electrodes. Accordingly, the damage of the light emitting structure caused by static electricity can be prevented.

Second, in order to improve the dispersibility of the first particles, the threshold voltage of the electrostatic discharge suppression pattern can be adjusted by adjusting an amount of second particles which are further dispersed in the resin or by adjusting diameters of the first particles.

DESCRIPTION OF DRAWINGS

FIG. 5 is a graph showing a threshold voltage of an electrostatic discharge suppression pattern according to diameters of conductive particles.

MODES OF THE INVENTION

Figure 1A:
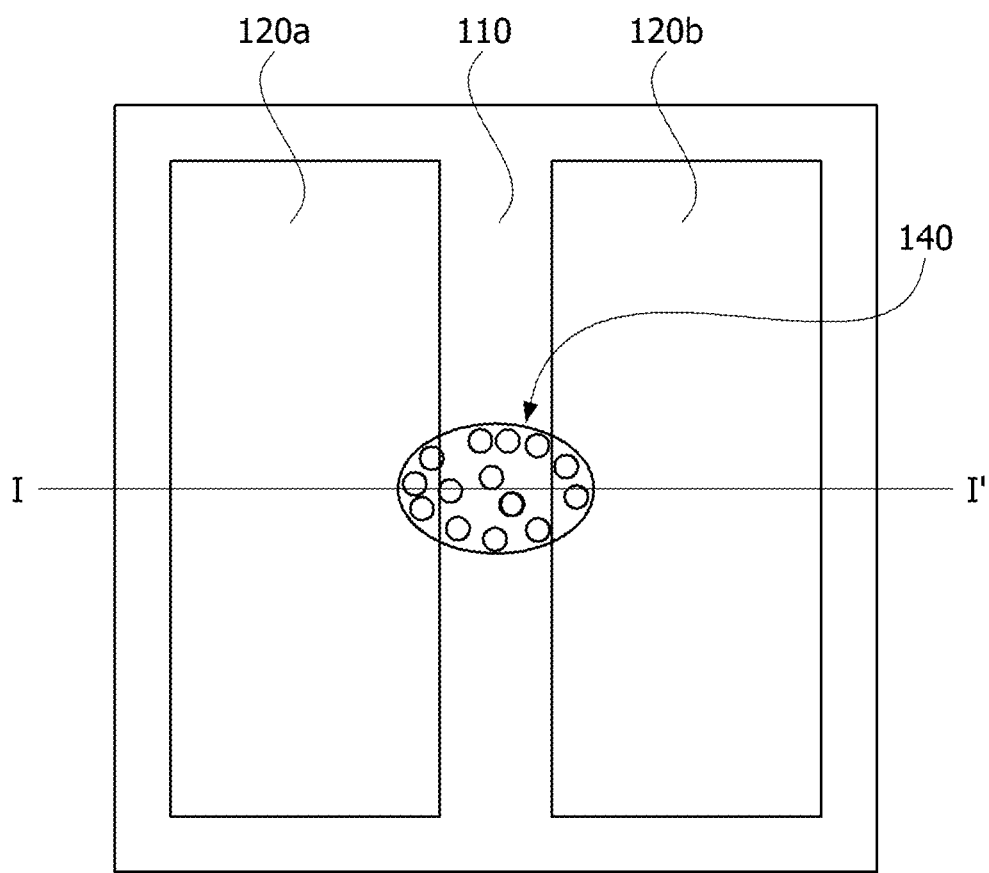
FIG. 1A is a bottom plan view of a light emitting device according to an embodiment of the present disclosure.

While the present disclosure is open to various modifications and alternative forms, specific embodiments thereof are shown by way of example in the drawings and will herein be described in detail. However, it should be understood that there is no intent to limit the present disclosure to the particular forms disclosed, and on the contrary, the present disclosure is to cover all modifications, equivalents, and alternatives falling within the spirit and scope of the present disclosure.

It should be understood that, although the terms "first," "second," etc. may be used herein to describe various elements, these elements are not to be limited by these terms. These terms are only used to distinguish one element from another. For example, a first element could be termed a second element and, similarly, a second element could be termed a first element without departing from the scope of the present disclosure. As used herein, the term "and/or" includes any and all combinations of one or more of the associated listed items.

It will be understood that when an element is referred to as being "connected" or "coupled" to another element, it can be directly connected or coupled to another element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the present disclosure. As used herein, the singular forms "a" and "an" are intended to include the plural forms as well unless the context clearly indicates otherwise. It should be further understood that the terms "comprise," "comprising," "include," and/or "including," when used herein, specify the presence of stated features, integers, steps, operations, elements, parts, and/or combinations thereof, but do not preclude the presence or addition of one or more other features, integers, steps, operations, elements, parts, and/or combinations thereof.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described in detail with reference to the accompanying drawings, the same or corresponding components are denoted by the same reference numerals regardless of reference numbers, and thus the description thereof will not be repeated.

Hereinafter, a light emitting device according to an embodiment will be described in detail with reference to the accompanying drawings.

Figure 1B:
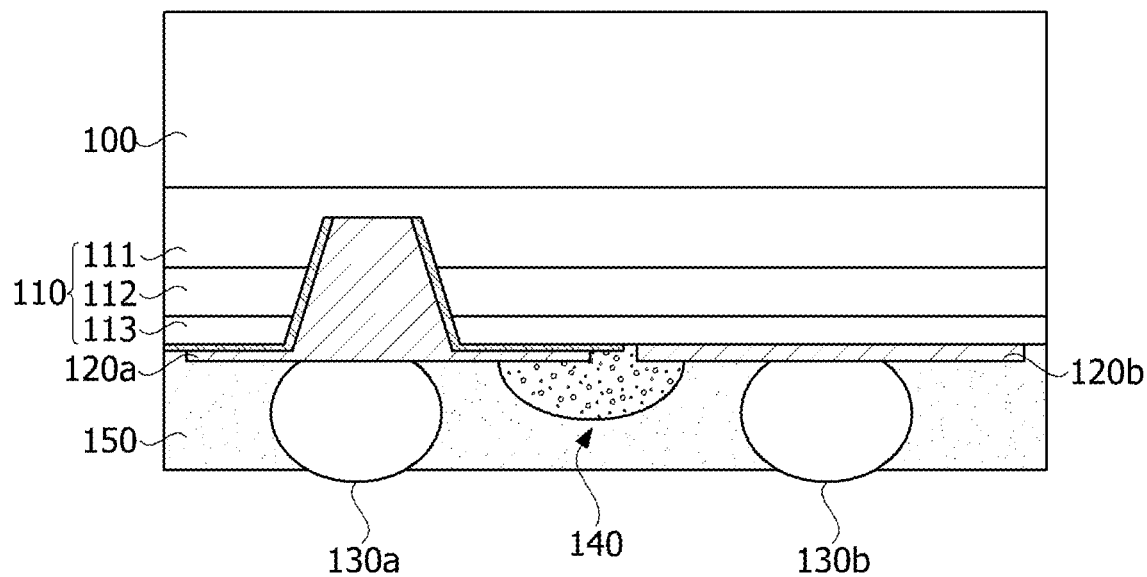
FIG. 1B is a cross-sectional view taken along line I-I' of FIG. 1A.
Figure 1C:
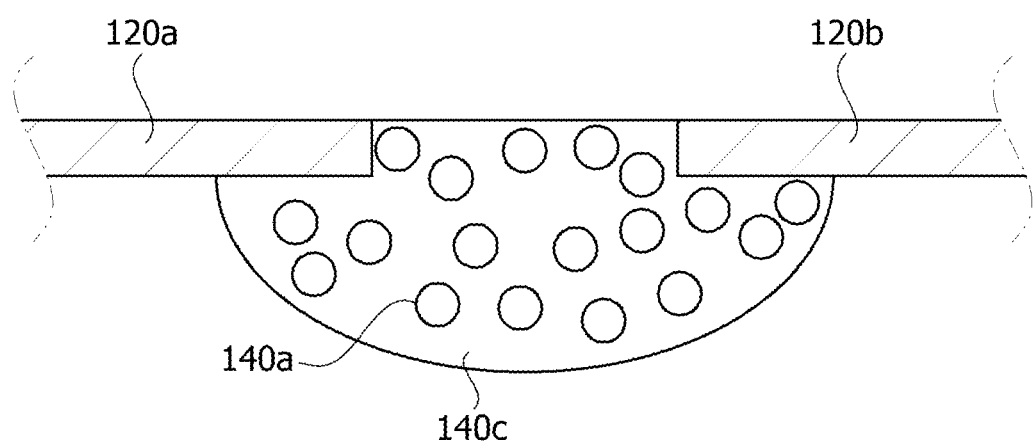
FIG. 1C is an enlarged sectional view of an electrostatic discharge suppression pattern of FIG. 1B.

FIG. 1A is a bottom plan view of a light emitting device according to an embodiment of the present disclosure, and FIG. 1B is a cross-sectional view taken along line I-I' of FIG. 1A. FIG. 1C is an enlarged sectional view of an electrostatic discharge (ESD) suppression pattern of FIG. 1B.

As shown in FIGS. 1A, 1B, and 1C, the light emitting device according to the embodiment includes a light emitting structure 110 including a first conductive semiconductor layer 111, an active layer 112, and a second conductive semiconductor layer 113, a first electrode 120a connected to the first conductive semiconductor layer 111, a second electrode 120b connected to the second conductive semiconductor layer 113, and an ESD suppression pattern 140 overlapping the first electrode 120a and the second electrode 120b, having first particles 140a conductive and dispersed in a resin 140c, and configured to cover a gap between the first electrode 120a and the second electrode 120b. Further, a filling layer 150 may be formed to cover the ESD suppression pattern 140 and the first and second electrodes 120a and 120b.

The light emitting device may be a light emitting device having a flip chip structure in which first and second electrodes 120a and 120b are disposed on a lower surface thereof and the first and second electrodes 120a and 120b are connected to a substrate (not shown), such as a printed circuit board, through a first bonding pad 130a and a second bonding pad 130b.

The light emitting structure 110 may be supported by a supporting substrate 100, and may include the first and second conductive semiconductor layers 111 and 113 and the active layer 112.

A structure in which the first and second electrodes 120a and 120b are electrically connected to the first and second conductive semiconductor layers 111 and 113 is not particularly limited. In FIG. 1B, an example of a structure through which the first electrode 120a passes to be connected to the first conductive semiconductor layer 111 is shown, but the present disclosure is not limited thereto, and all of general electrode structures such as a flip chip structure and a lateral chip structure may be used as the light emitting structure.

The first conductive semiconductor layer 111 may be implemented by a compound semiconductor such as a III-V group element, a II-VI group element, or the like, and may be doped with a first conductive dopant. For example, the first conductive semiconductor layer 111 may be a semiconductor layer having a composition formula of $In_xAl_yGa_{1-x-y}N$ ($0 \leq x \leq 1$, $0 \leq y \leq 1$, and $0 \leq x+y \leq 1$), and may be doped with an N-type dopant such as Si, Ge, Sn, or the like.

The active layer 112 may generate light using energy generated in a recombination process of electrons and holes which are provided from the first conductive semiconductor layer 111 and the second conductive semiconductor layer 113. The active layer 112 may be a semiconductor compound, for example, a compound semiconductor such as a III-V group element or a II-VI group element, and may be formed in a single well structure, a multi-well structure, a quantum wire structure, a quantum dot structure, or the like. When the active layer 112 has a quantum-well structure, the active layer 112 may have a single quantum-well structure or multi-quantum-well structure including a well layer having a composition formula of $In_xAl_yGa_{1-x-y}N$ ($0 \leq x \leq 1$, $0 \leq y \leq 1$, and $0 \leq x+y \leq 1$) and a barrier layer having a composition formula of $In_aAl_bGa_{1-a-b}N$ ($0 \leq a \leq 1$, $0 \leq b \leq 1$, and $0 \leq a+b \leq 1$). The well layer may be formed of a material having a bandgap smaller than that of the barrier layer.

The second conductive semiconductor layer 113 may be implemented with a compound semiconductor such as a III-V group element, a II-VI group element, or the like, and may be doped with a second conductive dopant. For example, the second conductive semiconductor layer 113 may be a semiconductor layer having a composition formula of $In_xAl_yGa_{1-x-y}N$ ($0 \leq x \leq 1$, $0 \leq y \leq 1$, and $0 \leq x+y \leq 1$), and may be doped with a P-type dopant such as Mg, Zn, Ca, Sr, Ba, or the like.

The first conductive semiconductor layer 111 and the second conductive semiconductor layer 113 of the light emitting structure 110 may be electrically connected to the first electrode 120a and the second electrode 120b, respectively.

However, when the light emitting device comes into contact with an object and ESD of several thousand volts or higher occurs, damage may be caused not only to the light emitting device but also to a power supply device and various other electronic devices which supply power to the light emitting device.

Conventionally, in order to prevent the damage of a light emitting device caused by ESD, during packaging of the light emitting device, an ESD prevention device such as a Zener diode, a varistor, a transient voltage suppression (TVS) device, or the like is mounted on the light emitting device. However, since a process of mounting the ESD prevention device is further added and the ESD prevention device absorbs light emitted from the light emitting device, a problem of lowering the light emitting output of the light emitting device occurs.

Therefore, in the embodiment of the present disclosure, the ESD suppression pattern 140 including the resin 140c in which one or more first particles 140a are conductive and dispersed are disposed between the first and second electrodes 120a and 120b so as to overlap the first electrode 120a and the second electrode 120b.

The ESD suppression pattern 140 has a structure in which the first particles 140a are dispersed in the resin 140c. The ESD suppression pattern 140 may be formed by applying and curing the resin 140c, in which the first particles 140a are dispersed, between the first and second electrodes 120a and 120b.

Specifically, the ESD suppression pattern 140 may function as an insulator at a voltage lower than a threshold voltage. To this end, the first particles 140a may be spaced apart from each other and uniformly dispersed in the resin 140c. That is, adjacent first particles 140a may be electrically insulated from each other at the voltage lower than the threshold voltage and thus the ESD suppression pattern 140 may function as an insulator.

Conversely, the adjacent first particles 140a may be conductive with each other at a voltage higher than or equal to the threshold voltage and thus the ESD suppression pattern 140 may function as a conductor.

Figure 1D:
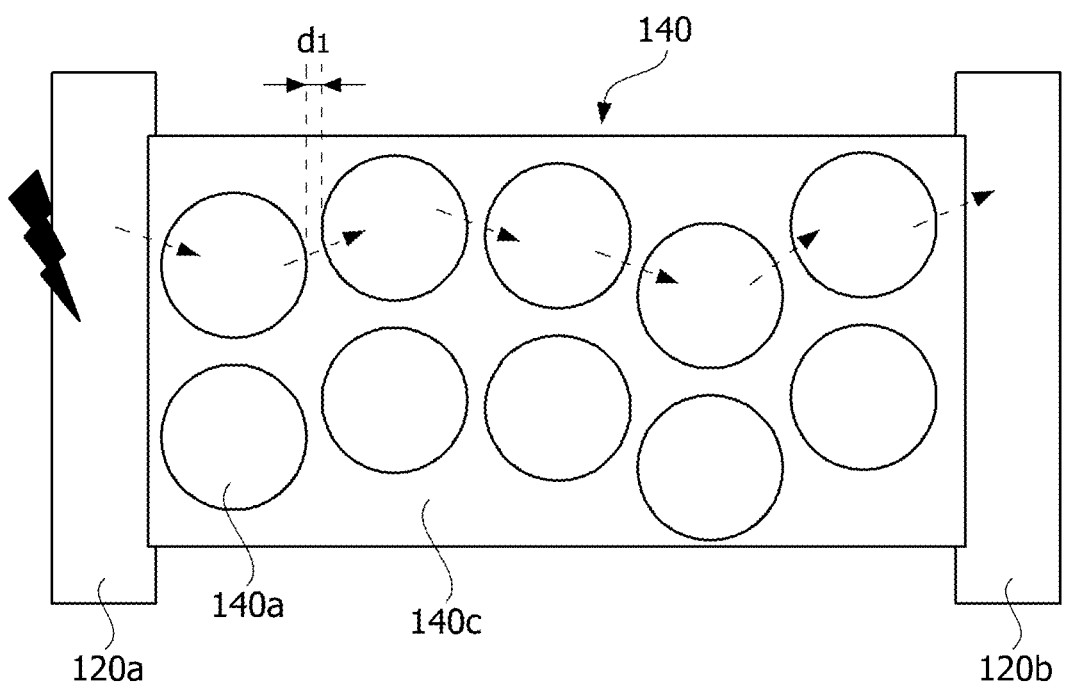
FIG. 1D is a plan view showing a schematic current-flow view of first particles of FIG. 1B when electrostatic discharge occurs.

FIG. 1D is a plan view showing a schematic current-flow view of the first particles of FIG. 1B when ESD occurs.

As shown in FIG. 1D, when the voltage higher than or equal to the threshold voltage is supplied to the light emitting device due to static electricity or the like, the first particles 140a which are physically spaced apart from each other may be electrically connected by a tunneling effect of the first particles 140a. In this case, tunneling effects also occurs between the first electrode 120a and the first particles 140a and between the second electrode 120b and the first particles 140a, and thus the ESD suppression pattern 140 may function as a conductor which is capable of connecting the first and second electrodes 120a and 120b. That is, at the voltage higher than or equal to the threshold voltage, a current path may be formed in at least a section between the first and second electrodes 120a and 120b.

Therefore, the adjacent first particles 140a are present to be physically spaced apart from each other so that the ESD suppression pattern 140 may function as an insulator, and at a voltage higher than or equal to the threshold voltage, the first particles 140a are preferably spaced apart from each other in a state of being maximally adjacent so that the first particles 140a are electrically connected to each other by the tunneling effect. To this end, a distance $d_1$ between the adjacent first particles 140a preferably ranges from 2 µm to 20 µm, or from 4 µm to 5 µm.

The resin 140c may be selected from an acrylic resin, an epoxy resin, a urethane resin, a silicone resin, and the like, but the present disclosure is not limited thereto.

The first particles 140a may be a metal having conductivity such as Ag, Al, Cu, or the like, and may be selected from a metal carbide such as SiC. Further, in some cases, when a distance between the first and second electrodes 120a and 120b is several nanometers, the first particles 140a may be carbon nanotubes (CNTs).

For example, when the first particles 140a include a metal, a coating film may be formed on surfaces of the first particles 140a to surround the first particles 140a and prevent the oxidation of the first particles 140a. In this case, the coating film may be made of a metal having an oxidation property lower than that of the first particles 140a, or may be made of a material having an insulating property. For example, the coating film may be formed of a metal oxide, such as ZnO or the like, or Ag having a low oxidation property.

For example, when Cu having a high oxidation property is used as the first particles 140a, Ag having an oxidation property lower than that of Cu may be used as the coating film. Further, when Al having a low oxidation property is used as the first particles 140a, the coating film may not be formed.

Specifically, in the case in which the coating film is formed of a metal, when a thickness of the coating film is too thin, the coating film may be oxidized while the resin 140c is cured. Further, in the case in which the coating film is formed of a metal oxide, when the thickness of the coating film is too thick, a tunneling effect may not occur between the adjacent first particles 140a. Therefore, the thickness of the coating film may range from 0.5 μm to 1.5 μm, but the present disclosure is not limited thereto.

As described above, in the embodiment of the present disclosure, since the ESD suppression pattern 140 disposed between the first and second electrodes 120a and 120b functions as an insulator or a conductor based on the threshold voltage thereof, the ESD suppression pattern 140 functions as a conductor and a current path is formed between the first and second electrodes 120a and 120b, and thus the damage of the light emitting structure 110 caused by static electricity may be prevented.

In this case, the characteristics of the ESD suppression pattern 140 may be improved as the dispersibility of the first particles 140a is increased.

Figure 2A:
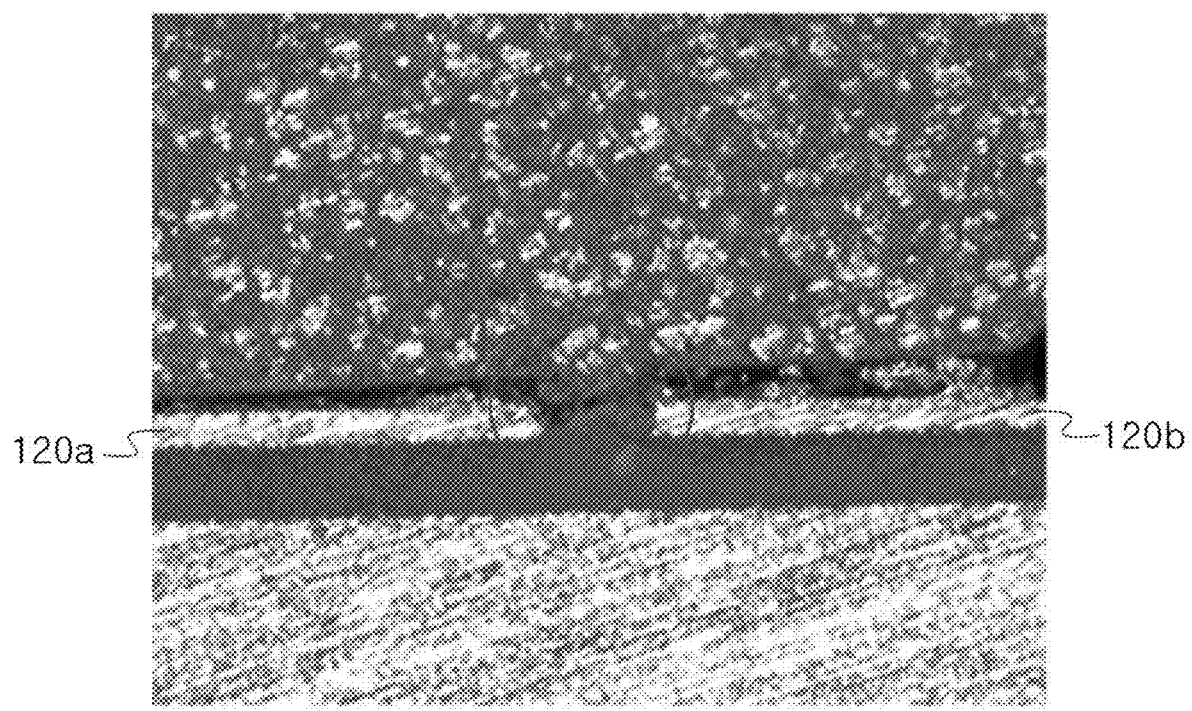
FIGS. 2A and 2B are photographs of electrostatic discharge suppression patterns having different dispersibility.
Figure 2B:
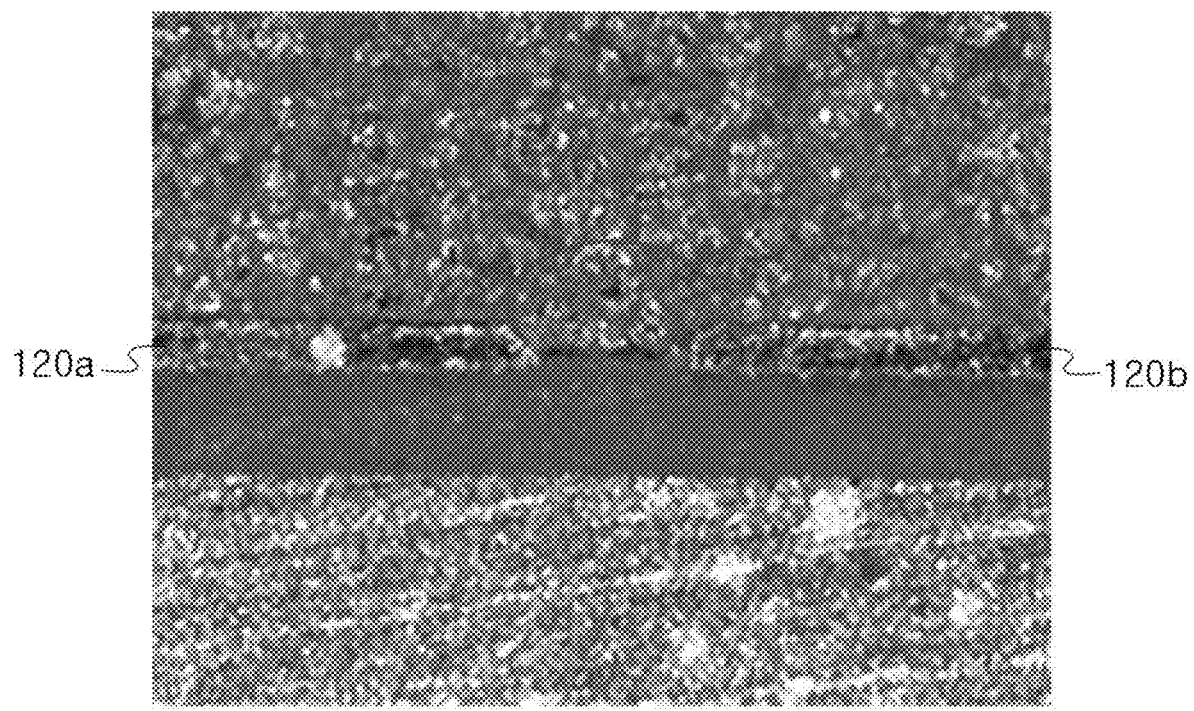

FIGS. 2A and 2B are photographs of ESD suppression patterns having different dispersibility.

As shown in FIG. 2A, when the dispersibility of the first particles 140a is low, the first particles 140a may not be disposed between the first and second electrodes 120a and 120b. In this case, even when a voltage higher than or equal to the threshold voltage is supplied, since the first particles 140a are not present between the first and second electrodes 120a and 120b, a problem in that the active layer 112 is damaged due to a current flowing in a reverse direction during ESD occurs.

However, as shown in FIG. 2B, when the dispersibility of the first particles 140a is high and the first particles 140a are uniformly dispersed in the resin 140c, the first particles 140a may be uniformly disposed between the first and second electrodes 120a and 120b. For example, when the distance between the first and second electrodes 120a and 120b is 150 μm, four or five first particles 140a having a diameter of 30 μm to 40 μm are preferably dispersed between the first and second electrodes 120a and 120b.

However, the first particles 140a may not be uniformly dispersed and the adjacent first particles 140a may be agglomerated. Therefore, in the embodiment of the present disclosure, in order to improve the dispersibility of the first particles 140a, a dispersant or a solvent may be further added to the resin 140c or second particles different from the first particles 140a may be further added to the resin 140c. In this case, the second particles may have an insulating property or may be conductive as the first particles 140a.

Hereinafter, the structure in which the second particles different from the first particles 140a are further added to the resin 140c will be described in detail.

Figure 3A:
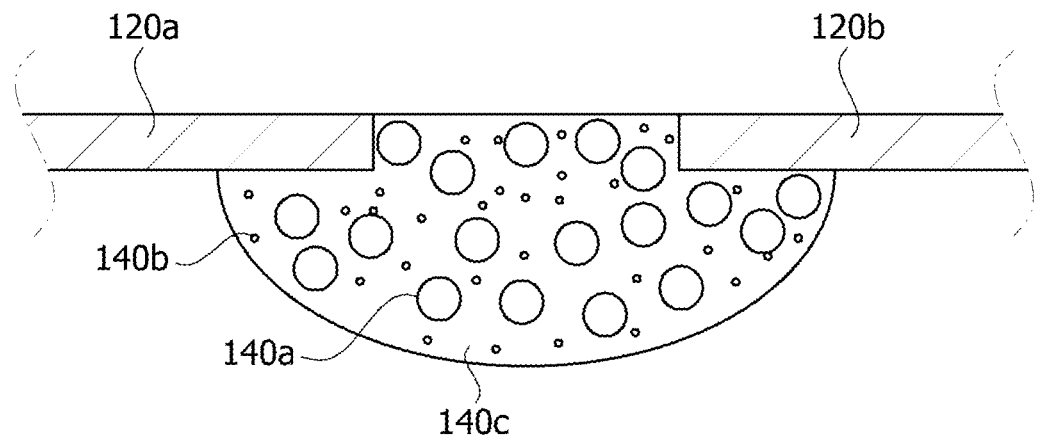
FIG. 3A is a cross-sectional view an electrostatic discharge suppression pattern according to another embodiment of the present disclosure.
Figure 3B:
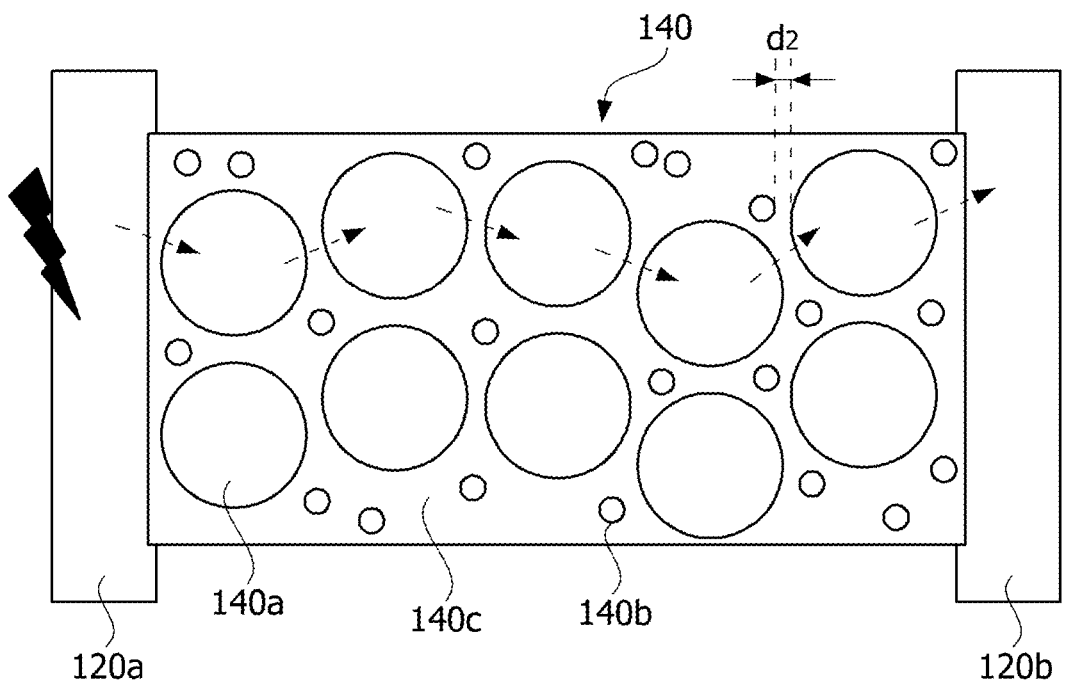
FIG. 3B is a plan view showing a schematic current-flow view of first particles of FIG. 3A when electrostatic discharge occurs.

FIG. 3A is a cross-sectional view an ESD suppression pattern according to another embodiment of the present disclosure, and FIG. 3B is a plan view showing a schematic current-flow view of first particles of FIG. 3A when ESD occurs.

As shown in FIGS. 3A and 3B, second particles 140b may prevent the connection of adjacent first particles 140a and thus the dispersibility of the first particles 140a may be improved.

Meanwhile, a distance $d_2$ between the first particle 140a and the second particle 140b may vary according to the characteristics of the second particles 140b.

For example, when the second particles 140b have an insulating property, the first particles 140a and the second particles 140b may be in contact with each other. On the other hand, when the second particles 140b are conductive as the first particles 140a, the second particles 140b and the first particles 140a should be spaced apart from each other and the distance $d_2$ therebetween preferably ranges from 4 μm to 5 μm like the distance $d_1$ between the adjacent first particles 140a of FIG. 1C.

In addition, when the second particles 140b are further dispersed in the resin 140c, the characteristics of the ESD suppression pattern are adjusted according to an amount of the second particles 140b.

When the second particles 140b having an insulating property are further added to the resin 140c, the second particles 140b may function as a material which interferes with the physical contact of the adjacent first particles 140a. In this case, when the amount of the second particles 140b is too high, the ESD suppression pattern 140 may substantially function as an insulator. Further, when the amount of the second particles 140b is too low, the physical contact of the adjacent first particles 140a may not be prevented.

Further, in the case in which the second particles 140b have conductivity, when the amount of the second particles 140b is too high, the ESD suppression pattern 140 may substantially function as a conductor.

Therefore, the amount of the second particles 140b may be lower than the amount of the first particles 140a and may have a percentage by weight (wt %) of 10% or more of the ESD suppression pattern 140, but the present disclosure is not limited thereto. This is because the threshold voltage is adjusted according to the amount of the second particles 140b.

Figure 4A:
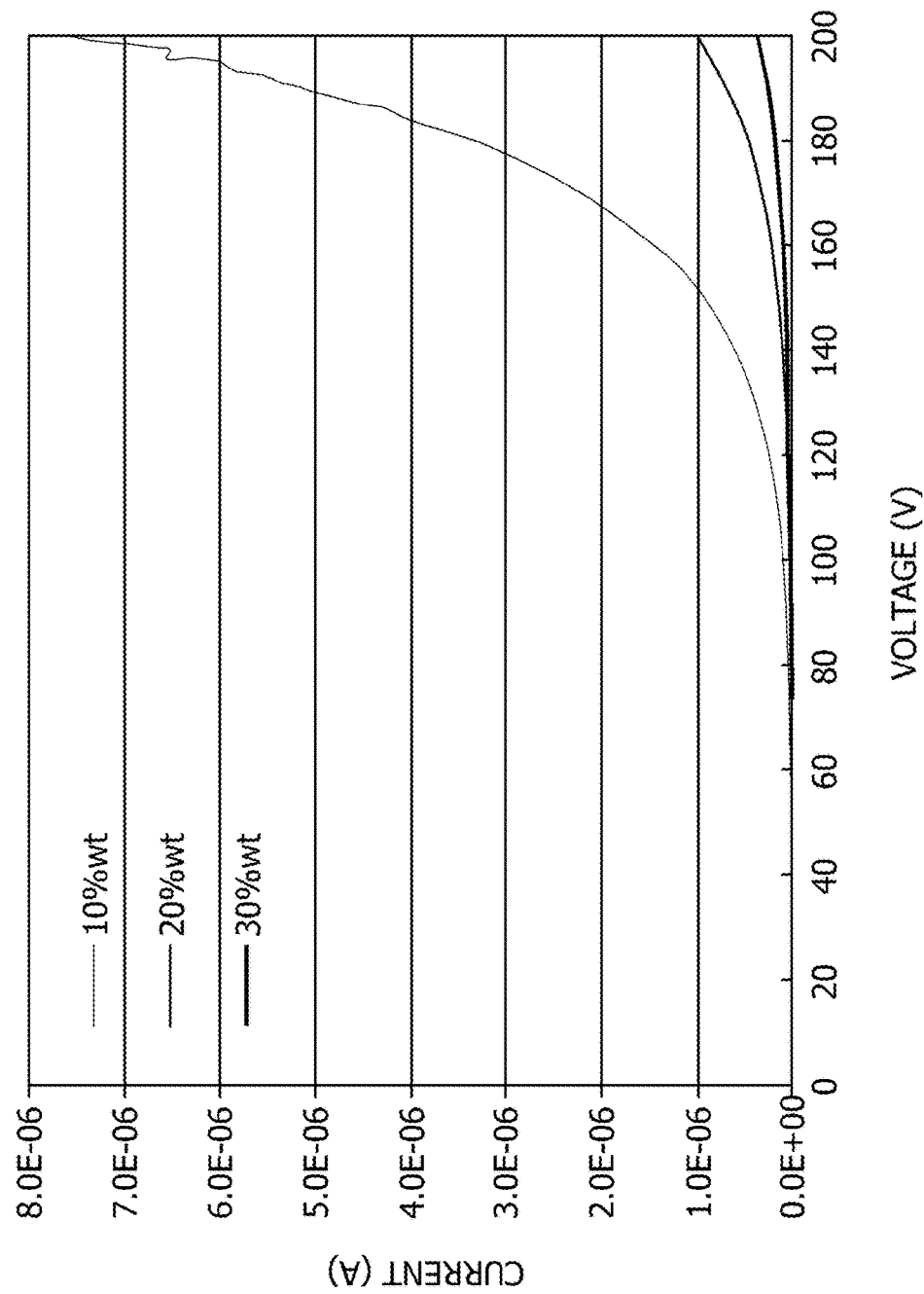
FIG. 4A is a graph showing a current according to a percentage by weight of second particles.
Figure 4B:
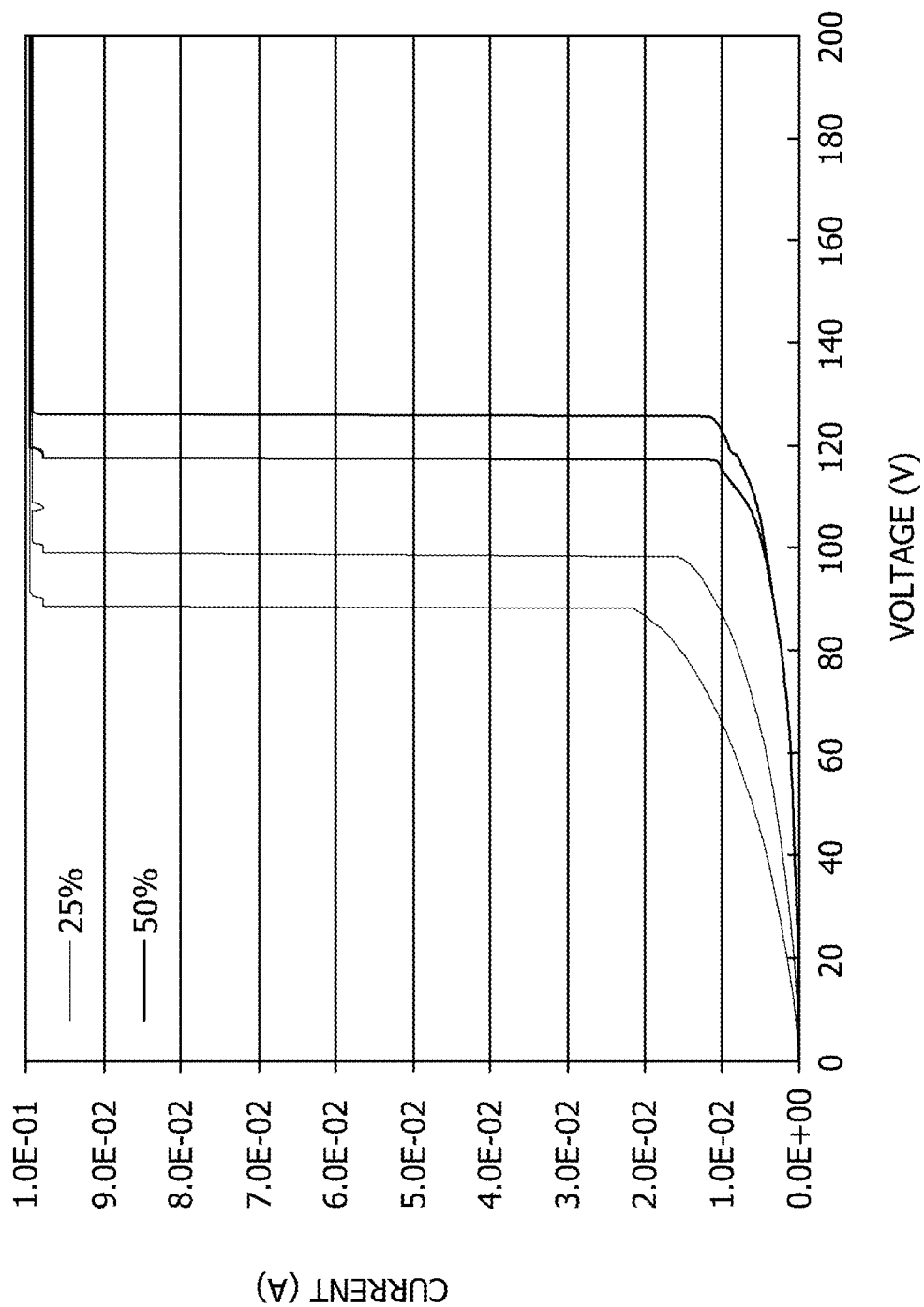
FIG. 4B is a graph showing a current according to an amount of second particles.

FIG. 4A is a graph showing a current according to a percentage by weight of second particles, and FIG. 4B is a graph showing a current according to an amount of the second particles.

As shown in FIG. 4A, when the first particles 140a have SiC and the second particles 140b have oxidized SiC, as a percentage by weight of the second particles 140b increases, the threshold voltage of the ESD suppression pattern 140 increases. This is because the insulating property of the ESD suppression pattern 140 is improved as the percentage by weight of the second particles 140b is increased because the second particles 140b are insulators.

Further, as shown in FIG. 4B, even when the first particles 140a have SiC and the second particles 140b have ZnO, when the amount of the second particles 140b is doubled, the threshold voltage of the ESD suppression pattern 140 is increased.

The threshold voltage of the ESD suppression pattern 140 may also be adjusted according to the diameters of the first particles 140a.

FIG. 5 is a graph showing the threshold voltage of the ESD suppression pattern according to diameters of conductive particles.

As shown in FIG. 5, when the distance between the first and second electrodes 120a and 120b is equal to 150 the threshold voltage of the ESD suppression pattern 140 including the first particles 140a having a diameter of 35 μm is about 80 V. However, the threshold voltage of the ESD suppression pattern 140 including the first particles 140a having a diameter of 45 μm is about 100 V.

That is, as the diameters of the first particles 140a decrease, the threshold voltage of the ESD suppression pattern 140 decreases. This is because as the diameters of the first particles 140a decrease, a more amount of the first particles 140a may be disposed between the first and second electrodes 120a and 120b, and the distance $d_1$ between the adjacent first particles 140a decreases so that a tunneling effect may occur between the first particles 140a even at a low voltage.

Conversely, as the diameters of the first particles 140b increase, the number of the first particles 140b which may be disposed between the first and second electrodes 120a and 120b decreases. Accordingly, the distance $d_1$ between the adjacent first particles 140a also increases and the threshold voltage increases. Further, as the diameters of the first particles 140a increase, the distance $d_1$ between the first particles 140a also increases so that a voltage of thousands of volts or higher generated when the light emitting device comes in contact with an object may be supplied to the light emitting structure 110 before a current path is formed between the first electrode 120a and the second electrode 120b through the first particles 140a which may cause a failure of the light emitting device.

Table 1 below is a comparison table of ESD suppression characteristics of the embodiment of the present disclosure.

TABLE 1

| Diameter of First Particle (μm) | Distance between First and Second Electrodes (μm) | Electrostatic Discharge Suppression Characteristic Evaluation | | |
|---|---|---|---|---|
| | | Number of Tests | Number of Failures | Failure Rate (%) |
| 35 | 150 | 12 | 0 | 0 |
| 45 | 150 | 19 | 1 | 5.3 |

As shown in Table 1, in the case in which the distances between the first and second electrodes 120a and 120b are the same and the diameters of the first particles 140a are different, as the diameter of the first particle 140a increases, a failure occurs more easily. In this case, the failure is determined as whether a leakage current of 10-8 A at a driving voltage (10 V) of a general light emitting device is generated.

Figure 6A:
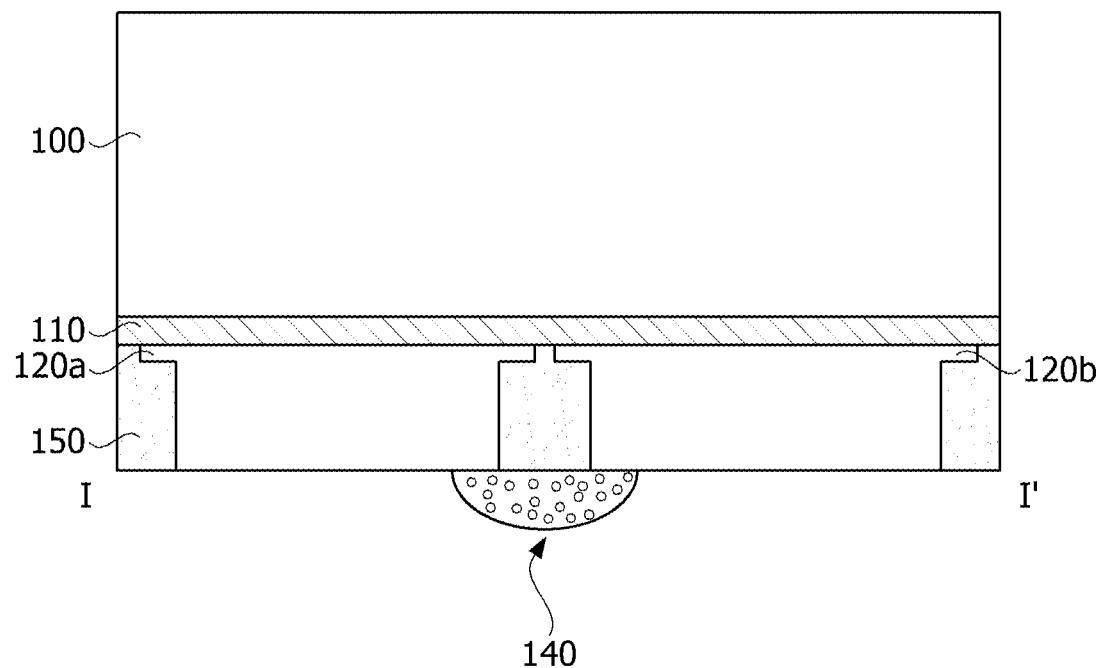
FIG. 6A is a cross-sectional view taken along line I-I' of FIG. 1A according to another embodiment of the present disclosure.

FIG. 6A is a cross-sectional view taken along line I-I' of FIG. 1A according to another embodiment of the present disclosure.

As shown in FIG. 6A, an ESD suppression pattern 140 covers a surface of a filling layer 150 which insulates first and second electrodes 120a and 120b, and overlaps the first and second electrodes 120a and 120b. In this case, the first and second electrodes 120a and 120b are formed to be thicker than the first and second electrodes 120a and 120b of FIG. 1A. Since the ESD suppression pattern 140 of FIG. 6A has an insulating property by default, the ESD suppression pattern 140 may be in contact with a bonding material such as a solder or the like which electrically connects the first and second electrodes 120a and 120b to a substrate such as a circuit board or the like.

Specifically, although the filling layer 150 is shown as fully surrounding side surfaces of the first and second electrodes 120a and 120b in the drawing, a gap between the first and second electrodes 120a and 120b may be partially filled with the filling layer 150. In this case, the ESD suppression pattern 140 may overlap the first and second electrodes 120a and 120b while the gap between the first and second electrodes 120a and 120b is partially filled with the filling layer 150.

Figure 6B:
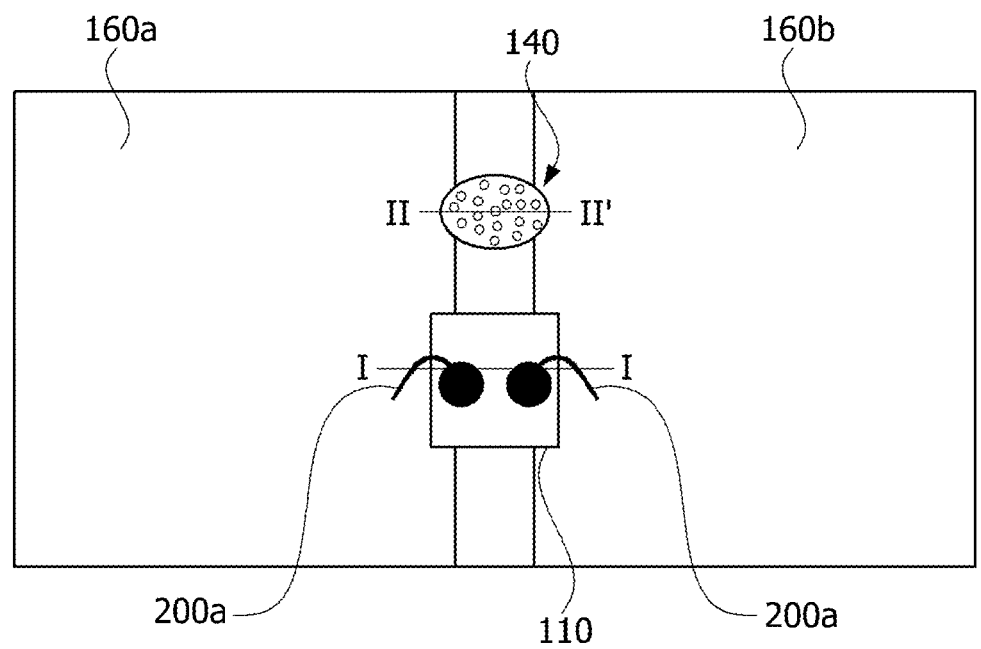
FIG. 6B is a top plan view of a light emitting device according to another embodiment of the present disclosure.
Figure 6C:
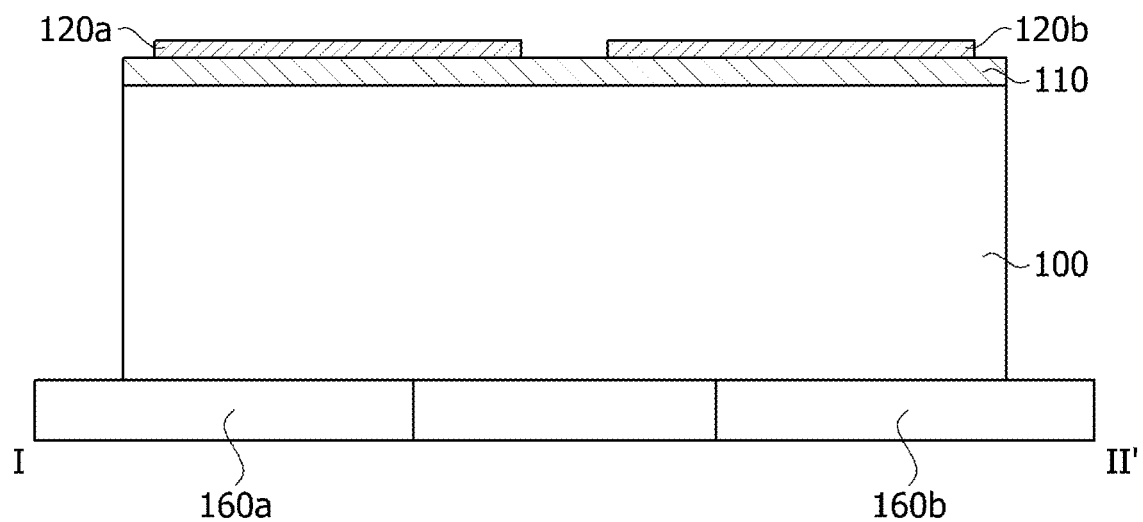
FIG. 6C is a cross-sectional view taken along line I-I' of FIG. 6B.

FIG. 6B is a top plan view of a light emitting device according to another embodiment of the present disclosure. FIG. 6C is a cross-sectional view taken along line I-I' of FIG. 6B, and FIG. 6D is a cross-sectional view taken along line II-II' of FIG. 6B.

Figure 6D:
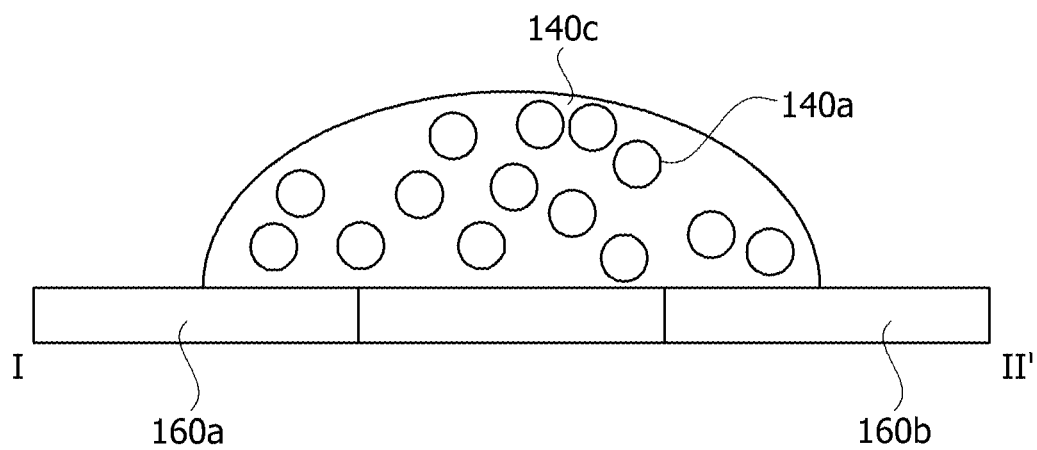
FIG. 6D is a cross-sectional view taken along line II-II' of FIG. 6B.

As shown in FIGS. 6B, 6C, and 6D, when the light emitting device according to the embodiment of the present disclosure is a lateral light emitting device in which first and second electrodes 120a and 120b are connected to first and second lead frames 160a and 160b through wires 200a and 200b, respectively, an ESD suppression pattern 140 may be disposed to overlap the first lead frame 160a and the second lead frame 160b in a region in which a Zener diode is generally disposed and cover a gap between the first lead frame 160a and the second lead frame 160b.

That is, when a voltage higher than or equal to a threshold voltage is supplied between the first electrodes 120a and second electrodes 120b, the ESD suppression pattern 140 of FIG. 6B may be formed somewhere on the first and second lead frames 160a and 160b in order to connect the first and second electrodes 120a and 120b to each other.

In the light emitting device of the embodiment of the present disclosure as described above, only the first particles 140a are dispersed in the resin 140c, or the ESD suppression pattern 140 including the resin 140c in which first particles 140a and second particles 140b are dispersed is disposed between the first and second electrodes 120a and 120b and disposed to partially cover the first and second electrodes 120a and 120b. In this case, the ESD suppression pattern 140 may function as an insulator or a conductor based on a threshold voltage thereof. At a voltage higher than or equal to the threshold voltage, the ESD suppression pattern 140 may function as a conductor and a current path may be formed between the first and second electrodes 120a and 120b. Accordingly, the damage of the light emitting structure 110 by static electricity may be prevented.

Further, the threshold voltage of the ESD suppression pattern 140 may be adjusted by adjusting the amount of the second particles 140b or by adjusting the diameters of the first particles 140a.

Hereinafter, a method of manufacturing an ESD suppression pattern according to an embodiment of the present disclosure will be described as follows.

Figure 7:
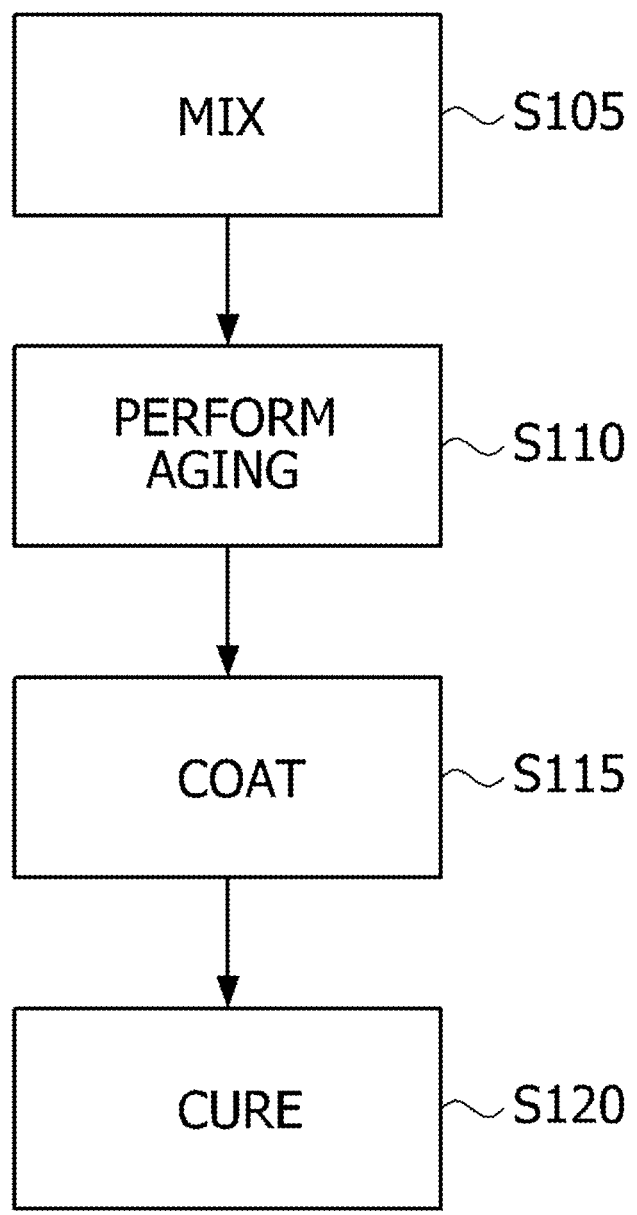
FIG. 7 is a block diagram showing a method of manufacturing an electrostatic discharge suppression pattern according to an embodiment of the present disclosure.

FIG. 7 is a block diagram showing the method of manufacturing the ESD suppression pattern according to the embodiment of the present disclosure.

As shown in FIG. 7, the first particles 140a and the second particles 140b are dispersed to be mixed in the resin 140c to form a mixed solution (S105). For example, the first particles 140a having the surfaces coated with Ag and the second particles 140b including SiC may be dispersed in an acrylic resin 140c.

In this case, when the amount of the second particles 140b having an insulating property is increased, the amount of the first particles 140a is relatively lowered, so that sufficient conductivity of the ESD suppression pattern is difficult to achieve. In the case in which the second particles 140b have conductivity, when the amount of the second particles 140b is increased, the first and second particles 140a, 140b may be connected to each other. Conversely, when the amount of the second particles 140b is too low, the second particles 140b may not sufficiently perform a function to improve the dispersibility of the first particles 140a.

Therefore, a mixing ratio of the first particles 140a and the second particles 140b may range from 60:40 to 70:30.

Further, the percentage by weight of the first and second particles 140a and 140b may range from 85 wt % to 87.5 wt % of the mixed solution containing the resin 140c. This is because when the amounts of the first and second particles 140a and 140b are too low, the number of the first and second particles 140a and 140b per unit distance in the mixed solution decreases so that an operation voltage of the ESD suppression pattern increases and a response speed decreases. Conversely, this is because when the amounts of the first and second particles 140a and 140b are too high, the number of the first and second particles 140a and 140b per unit distance in the mixed solution increases so that the adjacent first particles 140a may be connected to each other.

The first particles 140a and the second particles 140b may be mixed into the resin 140c using a three roll mill method in which three rolls are used so that the first particles 140a and the second particles 140b are uniformly dispersed. Further, the three roll mill method may be performed three or four times so that the first particles 140a and the second particles 140b are sufficiently dispersed.

In addition, after an aging process is performed on the mixed solution for about 30 minutes (S110), a gap between the first electrode 120a and the second electrode 120b is coated with the mixed solution so as to overlap the first and second electrodes 120a and 120b (S115). Next, the ESD suppression pattern 140 may be formed by curing the mixed solution (S120).

Figure 8:
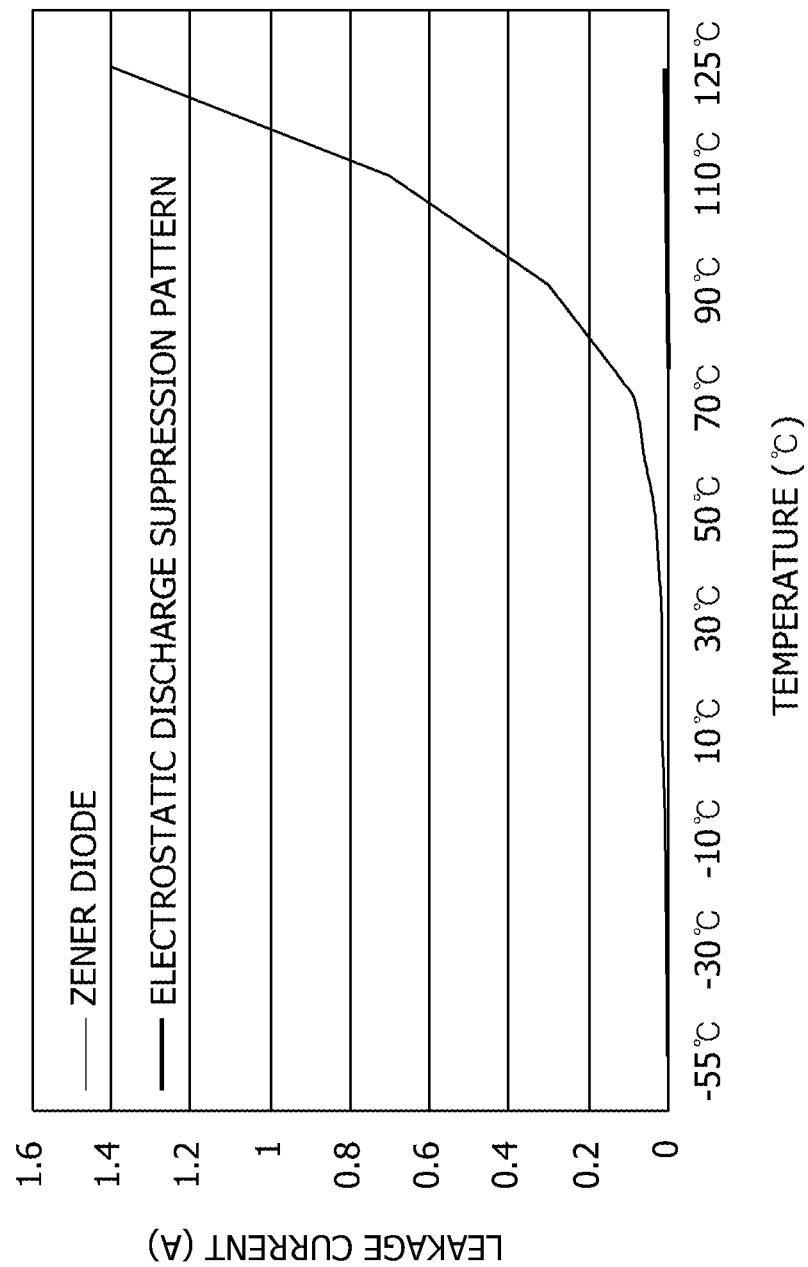
FIG. 8 is a comparison graph showing leakage currents according to temperatures of a Zener diode and the electrostatic discharge suppression pattern according to the embodiment of the present disclosure.

FIG. 8 is a comparison graph showing leakage currents according to temperatures of a Zener diode and the ESD suppression pattern according to the embodiment of the present disclosure, and the leakage current is measured after maintaining a temperature for 20 minutes.

As shown in FIG. 8, generally, in the Zener diode used for preventing ESD, as the temperature increases, the generation of a leakage current increases. Therefore, in a light emitting diode package in which the Zener diode is mounted, a leakage current is generated due to an external high temperature or heat generated when a light emitting device is driven, and thus reliability is lowered. In addition, there are many restrictions on the mounting position of the Zener diode because the Zener diode is susceptible to heat.

On the other hand, in the ESD suppression pattern of the present disclosure, a leakage current is hardly generated at a high temperature of 100° C. or higher. Therefore, the light emitting device including the ESD suppression pattern 140 according to the embodiment of the present disclosure is very reliable even with a change in temperature, and thus the light emitting device according to the embodiment of the present disclosure may function as a backlight unit along with an optical member such as a light guide plate, a prism sheet, a diffusion sheet, or the like. Further, the light emitting device according to the embodiment may be further applied to a display device, a lighting device, and an indication device.

In this case, the display device may include a bottom cover, a reflector, a light emitting module, a light guide plate, an optical sheet, a display panel, an image signal output circuit, and a color filter. The bottom cover, the reflector, the light emitting module, the light guide plate, and the optical sheet may constitute a backlight unit.

The reflector is disposed on the bottom cover and the light emitting module emits light. The light guide plate is disposed in front of the reflector to guide light emitted from a light emitting device forward, and the optical sheet includes a prism sheet or the like and is disposed in front of the light guide plate. The display panel is disposed in front of the optical sheet, the image signal output circuit supplies an image signal to the display panel, and the color filter is disposed in front of the display panel.

The lighting device may include a light source module including a substrate and the light emitting device of the embodiment, a heat dissipation unit which dissipates heat of the light source module, and a power supply which processes or converts an electrical signal provided from the outside to provide the processed or converted electrical signal to the light source module. In addition, the lighting device may include a lamp, a headlamp, a streetlamp, or the like.

While the exemplary embodiments of the present disclosure and their advantages have been described in detail with reference to the accompanying drawings, it will be apparent to those skilled in the art to which the present disclosure belongs that various changes, substitutions and alterations may be made herein without departing from the scope of the present disclosure.

The invention claimed is:

1. A light emitting device comprising:
   a light emitting structure including a first conductive semiconductor layer, an active layer, and a second conductive semiconductor layer;
   a first electrode connected to the first conductive semiconductor layer;
   a second electrode connected to the second conductive semiconductor layer; and
   an electrostatic discharge suppression pattern configured to overlap the first electrode and the second electrode, having first particles conductive and dispersed in a resin, having second particles which have conductivity or an insulating property different from the first particles and dispersed in the resin, and configured to cover a gap between the first electrode and the second electrode,
   wherein a percentage by weight of the first and second particles ranges from 85 wt % to 87.5 wt % of a mixed solution containing the resin.

2. The light emitting device of claim 1, a mixing ratio of the first particles and the second particles range from 60:40 to 70:30.

3. The light emitting device of claim 2, wherein diameters of the second particles are smaller than diameters of the first particles.

4. The light emitting device of claim 2, wherein an amount of the second particles is lower than an amount of the first particles and have a percentage by weight (wt %) of 10% or more of the electrostatic discharge suppression pattern.

5. The light emitting device of claim 1, wherein the electrostatic discharge suppression pattern has an insulating property or conductivity on the basis of a threshold voltage thereof.

6. The light emitting device of claim 5, wherein, when a voltage lower than the threshold voltage is supplied between the first electrode and the second electrode, the electrostatic discharge suppression pattern insulates the first electrode from the second electrode.

7. The light emitting device of claim 5, wherein, when a voltage higher than or equal to the threshold voltage is supplied between the first electrode and the second electrode, the electrostatic discharge suppression pattern electrically connects the first electrode to the second electrode.

8. The light emitting device of claim 1, further comprising a coating film with which surfaces of the first particles are coated.

9. The light emitting device of claim 8, wherein the coating film includes particles having an oxidation property lower than that of the first particles or a material having an insulating property.

10. The light emitting device of claim 1, wherein the first particles include carbon nano tubes.

11. A light emitting device comprising:
    a light emitting structure including a first conductive semiconductor layer, an active layer, and a second conductive semiconductor layer;
    a first electrode connected to the first conductive semiconductor layer;

a second electrode connected to the second conductive semiconductor layer;
a first lead frame connected to the first electrode through a first wire;
a second lead frame connected to the second electrode through a second wire; and
an electrostatic discharge suppression pattern configured to overlap the first lead frame and the second lead frame, having first particles conductive and dispersed in a resin, having second particles which have conductivity or an insulating property different from the first particles and dispersed in the resin, and configured to cover a gap between the first lead frame and the second lead frame,
wherein a percentage by weight of the first and second particles ranges from 85 wt % to 87.5 wt % of a mixed solution containing the resin.

12. The light emitting device of claim 11, a mixing ratio of the first particles and the second particles range from 60:40 to 70:30.

13. The light emitting device of claim 12, wherein diameters of the second particles are smaller than diameters of the first particles.

14. The light emitting device of claim 12, wherein an amount of the second particles is lower than an amount of the first particles and have a percentage by weight (wt %) of 10% or more of the electrostatic discharge suppression pattern.

15. The light emitting device of claim 11, wherein the electrostatic discharge suppression pattern has an insulating property or conductivity on the basis of a threshold voltage thereof.

16. The light emitting device of claim 15, wherein, when a voltage lower than the threshold voltage is supplied between the first lead frame and the second lead frame, the electrostatic discharge suppression pattern insulates the first lead frame from the second lead frame.

17. The light emitting device of claim 15, wherein, when a voltage higher than or equal to the threshold voltage is supplied between the first lead frame and the second lead frame, the electrostatic discharge suppression pattern electrically connects the first lead frame to the second lead frame.

18. The light emitting device of claim 11, further comprising a coating film with which surfaces of the first particles are coated.

19. The light emitting device of claim 18, wherein the coating film includes particles having an oxidation property lower than that of the first particles or a material having an insulating property.

20. The light emitting device of claim 11, wherein the first particles include carbon nano tubes.

* * * * *